(12) United States Patent
Kim

(10) Patent No.: US 7,839,477 B2
(45) Date of Patent: Nov. 23, 2010

(54) SUBSTRATE BONDING APPARATUS FOR LIQUID CRYSTAL DISPLAY PANEL

(75) Inventor: Jong Won Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 894 days.

(21) Appl. No.: 11/478,378

(22) Filed: Jun. 30, 2006

(65) Prior Publication Data

US 2007/0151673 A1    Jul. 5, 2007

(30) Foreign Application Priority Data

Dec. 29, 2005    (KR) ................... 10-2005-0133121

(51) Int. Cl.
    *G02F 1/1345* (2006.01)
(52) U.S. Cl. .................... 349/149; 438/458
(58) Field of Classification Search .......... 349/187
    See application file for complete search history.

(56) References Cited

U.S. PATENT DOCUMENTS

| | | | | |
|---|---|---|---|---|
| 2,880,030 A | * | 3/1959 | Horn | 294/65 |
| 2,905,768 A | * | 9/1959 | Cronquist | 360/230 |
| 2,916,059 A | * | 12/1959 | Wong | 141/65 |
| 3,466,079 A | * | 9/1969 | Mammel | 294/64.3 |
| 3,467,430 A | * | 9/1969 | Lowe | 294/65 |
| 3,499,640 A | * | 3/1970 | Berz | 269/21 |
| 3,499,714 A | * | 3/1970 | Schellenberg | 356/138 |
| 3,608,946 A | * | 9/1971 | Erickson et al. | 294/64.1 |
| 3,740,900 A | * | 6/1973 | Youmans et al. | 451/388 |
| 3,741,012 A | * | 6/1973 | Day | 73/150 A |
| 3,834,083 A | * | 9/1974 | Hoshi et al. | 451/168 |
| 3,884,061 A | * | 5/1975 | Westby | 72/38 |
| 3,910,621 A | * | 10/1975 | Hillier | 294/64.1 |
| 4,026,091 A | * | 5/1977 | Pearson | 53/390 |
| 4,049,484 A | * | 9/1977 | Priest et al. | 156/285 |
| 4,155,583 A | * | 5/1979 | Mikos et al. | 294/65 |
| 4,448,404 A | * | 5/1984 | Ogawa et al. | 269/21 |
| 4,607,496 A | * | 8/1986 | Nagaura | 62/64 |
| 4,710,094 A | * | 12/1987 | Fierkens et al. | 198/750.12 |
| 4,818,169 A | * | 4/1989 | Schram et al. | 414/331.18 |
| 4,852,926 A | * | 8/1989 | Littell | 294/64.1 |
| 5,149,162 A | * | 9/1992 | Focke et al. | 294/64.1 |
| 5,230,741 A | * | 7/1993 | van de Ven et al. | 118/728 |
| 5,238,499 A | * | 8/1993 | van de Ven et al. | 118/724 |

(Continued)

FOREIGN PATENT DOCUMENTS

CN    1501147    6/2004

(Continued)

*Primary Examiner*—David Nelms
*Assistant Examiner*—Peter Radkowski
(74) *Attorney, Agent, or Firm*—McKenna Long & Aldridge LLP

(57) ABSTRACT

A substrate bonding apparatus for a liquid crystal display (LCD) panel is disclosed that subdivides its venting holes, thereby achieving an enhancement in uniformity of venting. The substrate bonding apparatus that bonds a first substrate and a second substrate using a venting process, includes a lower chucking plate which chucks the second substrate, and an upper chucking plate which includes a plurality of blocks each including a main venting hole, wherein the upper chucking plate chucks the first substrate in accordance with a chucking operation of the blocks, and subsequently releases the chucked first substrate such that the first substrate falls down toward the second substrate.

6 Claims, 18 Drawing Sheets

U.S. PATENT DOCUMENTS

| | | | | |
|---|---|---|---|---|
| 5,308,645 | A * | 5/1994 | Zachman et al. | 427/97.7 |
| 5,324,012 | A * | 6/1994 | Aoyama et al. | 269/21 |
| 5,326,420 | A * | 7/1994 | Vinouze et al. | 156/379 |
| 5,350,479 | A * | 9/1994 | Collins et al. | 156/345.53 |
| 5,374,594 | A * | 12/1994 | van de Ven et al. | 438/758 |
| 5,382,311 | A * | 1/1995 | Ishikawa et al. | 156/345.54 |
| 5,471,279 | A * | 11/1995 | Takizawa | 355/73 |
| 5,485,495 | A * | 1/1996 | Miyachi et al. | 378/34 |
| 5,522,975 | A * | 6/1996 | Andricacos et al. | 204/288.1 |
| 5,534,073 | A * | 7/1996 | Kinoshita et al. | 118/728 |
| 5,535,090 | A * | 7/1996 | Sherman | 361/234 |
| 5,539,609 | A * | 7/1996 | Collins et al. | 361/234 |
| 5,572,786 | A * | 11/1996 | Rensch | 29/559 |
| 5,583,737 | A * | 12/1996 | Collins et al. | 361/234 |
| 5,584,746 | A * | 12/1996 | Tanaka et al. | 451/41 |
| 5,624,499 | A * | 4/1997 | Mizuno et al. | 118/725 |
| 5,634,266 | A * | 6/1997 | Sherstinsky et al. | 29/825 |
| 5,646,814 | A * | 7/1997 | Shamouilian et al. | 361/234 |
| 5,671,117 | A * | 9/1997 | Sherstinsky et al. | 361/234 |
| 5,688,331 | A * | 11/1997 | Aruga et al. | 118/725 |
| 5,745,331 | A * | 4/1998 | Shamouilian et al. | 361/234 |
| 5,914,568 | A * | 6/1999 | Nonaka | 315/111.21 |
| 5,976,260 | A * | 11/1999 | Kinoshita et al. | 118/719 |
| 5,979,475 | A * | 11/1999 | Satoh et al. | 134/140 |
| 6,032,997 | A * | 3/2000 | Elliott et al. | 294/64.1 |
| 6,108,091 | A * | 8/2000 | Pecen et al. | 356/630 |
| 6,111,634 | A * | 8/2000 | Pecen et al. | 356/72 |
| 6,222,603 | B1 * | 4/2001 | Sakai et al. | 349/153 |
| 6,271,676 | B1 * | 8/2001 | Montoya | 324/765 |
| 6,334,840 | B1 * | 1/2002 | Asai et al. | 483/1 |
| 6,358,129 | B2 * | 3/2002 | Dow | 451/285 |
| 6,418,999 | B1 * | 7/2002 | Yanagita et al. | 156/584 |
| 6,422,922 | B1 * | 7/2002 | Okamura et al. | 451/41 |
| 6,527,625 | B1 * | 3/2003 | Kajiwara et al. | 451/41 |
| 6,544,341 | B1 * | 4/2003 | Omstead et al. | 118/729 |
| 6,559,928 | B1 * | 5/2003 | Aoki | 355/72 |
| 6,607,159 | B2 * | 8/2003 | Ohshio et al. | 242/528 |
| 6,611,417 | B2 * | 8/2003 | Chen | 361/234 |
| 6,692,575 | B1 * | 2/2004 | Omstead et al. | 118/728 |
| 6,784,970 | B2 * | 8/2004 | Lee et al. | 349/189 |
| 6,793,756 | B2 * | 9/2004 | Lee et al. | 156/224 |
| 6,798,488 | B2 * | 9/2004 | Murata et al. | 349/187 |
| 6,802,688 | B1 * | 10/2004 | Andersen et al. | 414/796.2 |
| 6,821,176 | B2 * | 11/2004 | Lee et al. | 445/24 |
| 6,823,986 | B2 * | 11/2004 | Vogel | 198/689.1 |
| 6,829,032 | B2 * | 12/2004 | Lee et al. | 349/187 |
| 6,848,963 | B2 * | 2/2005 | Lee et al. | 445/24 |
| 6,893,311 | B2 * | 5/2005 | Lee et al. | 445/24 |
| 6,953,073 | B2 * | 10/2005 | Lee et al. | 156/382 |
| 6,965,424 | B2 * | 11/2005 | Liu et al. | 349/187 |
| 6,991,699 | B2 * | 1/2006 | Lee et al. | 156/285 |
| 7,022,199 | B2 * | 4/2006 | Lee et al. | 156/106 |
| 7,040,525 | B2 * | 5/2006 | Lee et al. | 228/49.5 |
| 7,050,141 | B2 * | 5/2006 | Yokoue | 349/187 |
| 7,102,726 | B2 * | 9/2006 | Byun et al. | 349/189 |
| 7,105,056 | B2 * | 9/2006 | Hartig et al. | 118/50 |
| 7,136,134 | B2 * | 11/2006 | Yoshizoe | 349/154 |
| 7,163,033 | B2 * | 1/2007 | Hong | 141/65 |
| 7,199,855 | B2 * | 4/2007 | Yoshimi et al. | 349/187 |
| 7,199,994 | B1 * | 4/2007 | Levinson et al. | 361/234 |
| 7,202,933 | B2 * | 4/2007 | Murata et al. | 349/187 |
| 7,230,669 | B1 * | 6/2007 | Tashiro et al. | 349/153 |
| 7,256,860 | B2 * | 8/2007 | Lee et al. | 349/187 |
| 7,295,279 | B2 * | 11/2007 | Byun et al. | 349/187 |
| 7,419,420 | B2 * | 9/2008 | Togawa et al. | 451/7 |
| 7,434,856 | B2 * | 10/2008 | Gerhard et al. | 294/64.1 |
| 7,455,575 | B2 * | 11/2008 | Kim et al. | 451/444 |
| 7,520,800 | B2 * | 4/2009 | Duescher | 451/527 |
| 2001/0018322 | A1 * | 8/2001 | Dow | 451/287 |
| 2001/0020763 | A1 * | 9/2001 | Tokunaga | 269/21 |
| 2001/0024349 | A1 * | 9/2001 | Shamoulian et al. | 361/234 |
| 2002/0017365 | A1 * | 2/2002 | Gunji et al. | 156/345 |
| 2002/0055021 | A1 * | 5/2002 | Niwa | 428/698 |
| 2002/0127956 | A1 * | 9/2002 | Ashjaee et al. | 451/54 |
| 2002/0134504 | A1 * | 9/2002 | Yanagita et al. | 156/344 |
| 2002/0135968 | A1 * | 9/2002 | Chen | 361/234 |
| 2002/0150789 | A1 * | 10/2002 | Hiramatsu et al. | 428/688 |
| 2003/0008602 | A1 * | 1/2003 | Ashjaee et al. | 451/54 |
| 2003/0063251 | A1 * | 4/2003 | Murata et al. | 349/189 |
| 2003/0070765 | A1 * | 4/2003 | Eichlseder | 156/580 |
| 2003/0095244 | A1 * | 5/2003 | Komatsu | 355/72 |
| 2003/0145943 | A1 * | 8/2003 | Lee et al. | 156/285 |
| 2003/0178468 | A1 * | 9/2003 | Lee et al. | 228/102 |
| 2004/0001177 | A1 * | 1/2004 | Byun et al. | 349/187 |
| 2004/0099377 | A1 * | 5/2004 | Newton et al. | 156/345.33 |
| 2004/0145698 | A1 * | 7/2004 | Yokoue | 349/190 |
| 2004/0149687 | A1 * | 8/2004 | Choi et al. | 216/40 |
| 2004/0166789 | A1 * | 8/2004 | Ashjaee et al. | 451/388 |
| 2004/0212205 | A1 * | 10/2004 | Linker et al. | 294/64.1 |
| 2005/0011460 | A1 * | 1/2005 | Taniguchi | 118/728 |
| 2005/0030469 | A1 * | 2/2005 | Murata et al. | 349/187 |
| 2005/0095829 | A1 * | 5/2005 | Hara | 438/584 |

FOREIGN PATENT DOCUMENTS

| | | |
|---|---|---|
| CN | 1707323 | 12/2005 |
| JP | 55166219 A * | 12/1980 |
| JP | 02164021 A * | 6/1990 |
| JP | 04285486 A * | 10/1992 |
| JP | 6-034983 | 2/1994 |
| JP | 06182645 A * | 7/1994 |
| JP | 8-220548 | 8/1996 |
| JP | 2000021965 A * | 1/2000 |
| JP | 2001-525616 | 12/2001 |
| JP | 2003077983 A * | 3/2003 |
| JP | 2003-233053 | 8/2003 |
| JP | 2003-233080 | 8/2003 |
| JP | 2004-170974 | 6/2004 |
| JP | 2004-170975 | 6/2004 |
| JP | 2004-212444 | 7/2004 |
| JP | 2005-202431 | 7/2005 |
| JP | 2005-258325 | 9/2005 |
| JP | 2005-258468 | 9/2005 |
| JP | 2005-326873 | 11/2005 |
| JP | 2006-201330 | 8/2006 |
| WO | WO 2005/098522 | 10/2005 |

* cited by examiner

SUBSTRATE BONDING APPARATUS FOR LIQUID CRYSTAL DISPLAY PANEL

This application claims the benefit of Korean Patent Application No. 10-2005-0133121, filed on Dec. 29, 2005, which is hereby incorporated by reference for all purposes as if fully set forth herein. This application incorporates by reference co-pending application, Ser. No. 10/184,096, filed on Jun. 28, 2002 entitled "SYSTEM AND METHOD FOR MANUFACTURING LIQUID CRYSTAL DISPLAY DEVICES FROM LARGE MOTHER SUBSTRATE PANELS"; and co-pending application, Ser. No. 11/476,919, filed on Jun. 29, 2006, entitled "METHODS OF MANUFACTURING LIQUID CRYSTAL DISPLAY DEVICES" for all purposes as if fully set forth herein.

BACKGROUND OF THE INVENTION

1. Field of the Invention

The present invention relates to a substrate bonding apparatus for a liquid crystal display (LCD) panel, and more particularly, to a substrate bonding apparatus for an LCD panel that subdivides venting holes, thereby achieving an enhancement in uniformity of venting.

2. Discussion of the Related Art

As the information age advances, the demand for various display devices has increased. To meet this demand, research regarding flat panel display devices is ongoing including liquid crystal display devices (LCD), plasma display panels (PDP), electro-luminescent displays (ELD), vacuum fluorescent displays (VFD), and the like. Some flat panel display devices are being applied to various appliances for display purposes.

In particular, the LCD has been used as a substitute for the cathode ray tube (CRT) in association with mobile image display devices because the LCD has the advantages of superior picture quality, lightness, thinness, and low power consumption. Thus, the LCD is currently most widely used. Various applications for LCDs are being developed in addition to mobile image display devices such as monitors of notebook computers, but also TV monitors to receive and display broadcast signals and desktop computer monitors.

Although the LCD has been developed so that it can be used as picture display devices in various fields, the task to enhance the quality of images in such LCDs is made difficult by attempting to improve the above-mentioned features and advantages.

Accordingly, successful application of such LCDs to diverse image display devices depends on whether or not the LCD can realize desired high picture quality including high resolution, high brightness, large display area, and the like, while maintaining the desired characteristics of lightness, thinness, and low power consumption.

Methods for manufacturing the above-mentioned LCD are typically classified into a liquid crystal injection type and a liquid crystal dispensing type. In the liquid crystal injection method, a sealant pattern is written on one of upper and lower substrate such that the sealant pattern has an injection port. Thereafter, the substrates are bonded to each other under a vacuum condition. A liquid crystal material is then injected into a space defined between the substrates through the injection port. In the liquid crystal dispensing method, one substrate is prepared on which a liquid crystal material has been dispensed. Another substrate is prepared on which a sealant pattern is formed such that the sealant pattern extends completely along the peripheral edge of the substrate without forming an injection port. Thereafter, the latter substrate is arranged on the former substrate under a vacuum condition such that they are aligned with each other. The aligned substrates are then bonded to each other. Such a liquid crystal dispensing method is disclosed in Japanese Patent Application Nos. Heisei 11-089612 and Heisei 11-172903.

The liquid crystal dispensing method has an advantage in that the liquid crystal dispensing method uses a reduced number of processes by eliminating certain processes required in the liquid crystal injection method. For example, such processes may include forming a liquid crystal injection port, injecting a liquid crystal material, and sealing an injection port, and thus, does not use equipment for those processes.

For this reason, active research has recently been undertaken to provide various equipment for use in the liquid crystal dispensing method.

For example, the applicant proposed a substrate bonding apparatus for an LCD panel through Korean Patent Application No. 2002-71366 (Filing date: Nov. 16, 2002).

Where it is desired to bond an upper substrate (or a lower substrate) to a lower substrate (or an upper substrate) coated with a sealant along the peripheral edge of the lower substrate and with a liquid crystal material dispensed thereon, using the substrate bonding apparatus proposed by the applicant. The upper substrate is first attached to an upper electrostatic chuck (ESC) and is then lowered such that the upper substrate is near the lower substrate. The upper ESC is then turned off, thereby releasing the upper substrate which is, in turn, laid on the lower substrate. In this state, the substrate bonding apparatus performs a venting process to bond the upper and lower substrates to each other.

An example of the venting process is illustrated in FIG. 1A. As shown in FIG. 1A, during the venting process, a vacuum is formed in a space defined between an upper substrate 110 and a lower substrate 120, and sealed by a sealant 111 formed on the lower substrate 120, thereby generating a pressure difference between the space and the atmosphere. By virtue of the pressure difference, the upper substrate 110 and lower substrate 120 are bonded to each other.

However, as shown in FIG. 1B, the above-mentioned conventional substrate bonding apparatus has a problem in that venting is non-uniformly carried out in the venting process, thereby causing the bonding quality of the substrates to be poor. That is, when venting is non-uniformly carried out in the venting process, a gap is formed between the upper substrate 110 and the sealant 111. In this case, an air bubble may be introduced into the liquid crystal space, thereby causing the bonding quality of the substrates to be poor.

SUMMARY OF THE INVENTION

Accordingly, the present invention is directed to a substrate bonding apparatus for an LCD panel that substantially obviates one or more problems due to limitations and disadvantages of the related art.

An advantage of the present invention is to provide a substrate bonding apparatus for an LCD panel which subdivides venting holes, thereby achieving an enhancement in uniformity of venting.

Additional features and advantages of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a substrate bonding apparatus for a liquid crystal display panel for bonding a first substrate and a second substrate using a venting process includes: a lower chucking plate which chucks the second substrate; and an upper chucking plate which includes a plurality of blocks each including a main venting hole, wherein the upper chucking plate chucks the first substrate in accordance with a chucking operation of the blocks, and subsequently releases the chucked first substrate such that the first substrate falls down toward the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings, namely FIG. 2 to FIG. 16B. Wherever possible, the same reference numbers will be used throughout the drawings to refer to the same or like parts.

Figure 1A:
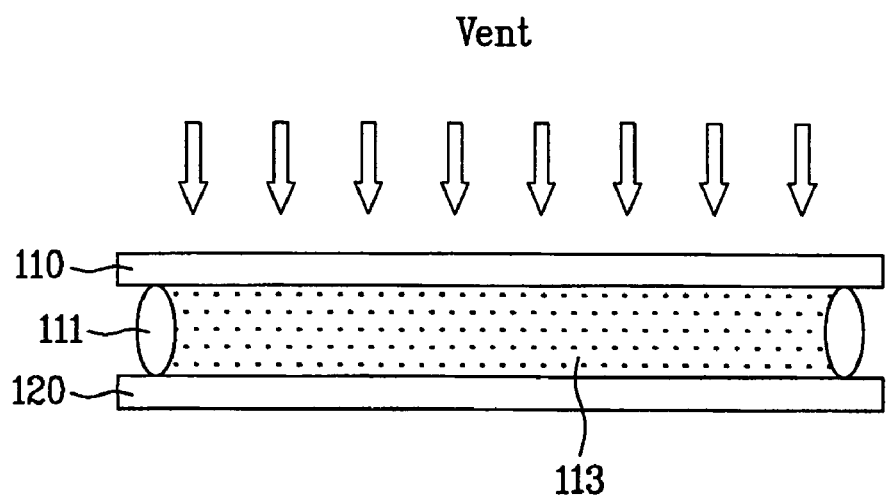
FIG. 1A is a schematic view illustrating bonding of substrates achieved in accordance with a uniform venting process.
Figure 1B:
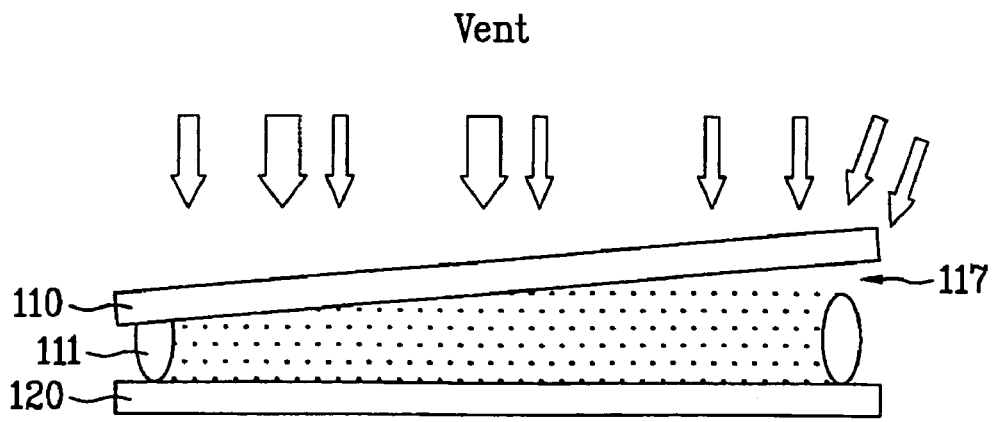
FIG. 1B is a schematic view illustrating bonding of substrates achieved in accordance with a non-uniform venting process.
Figure 2:
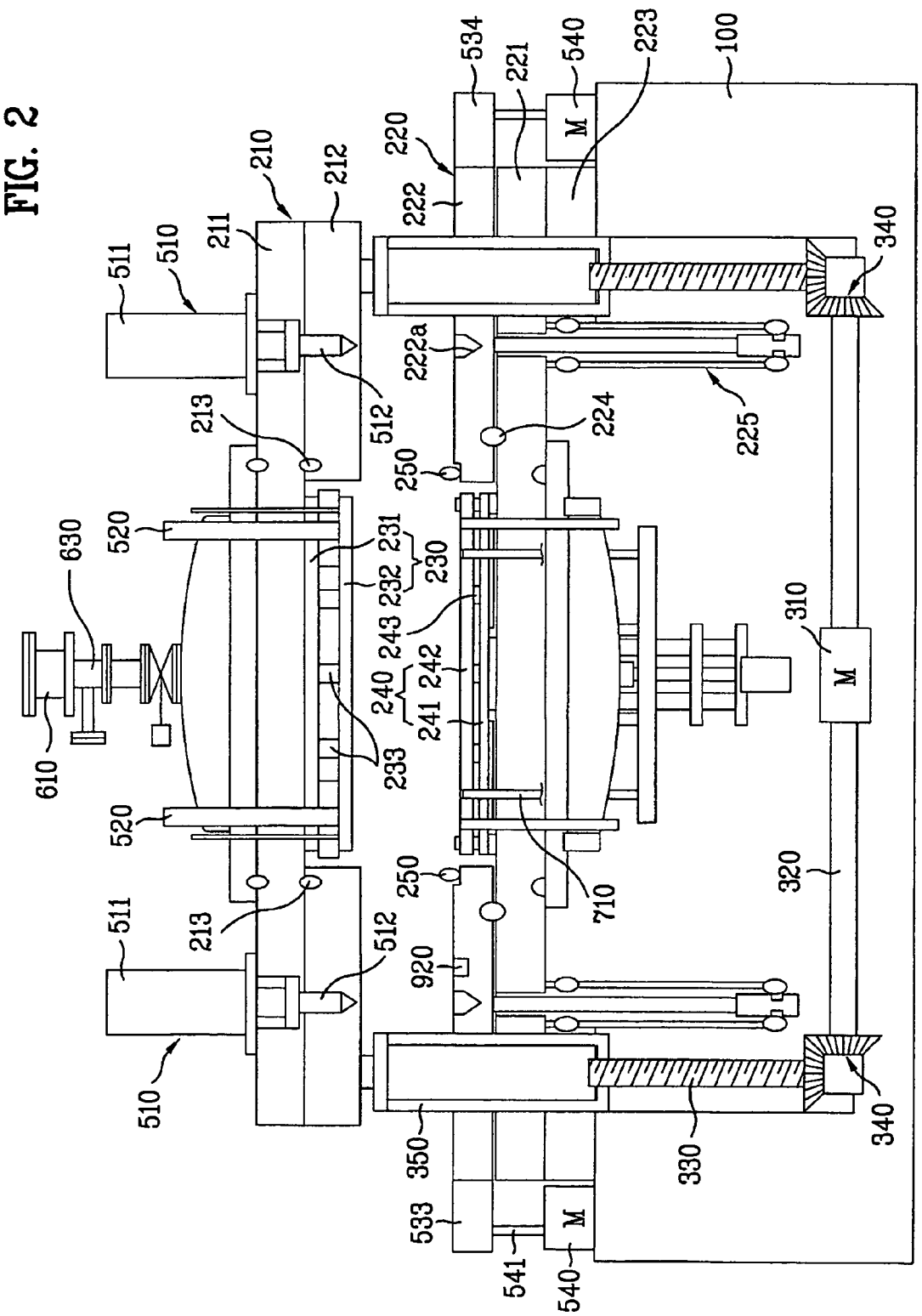
FIG. 2 is a schematic view illustrating an initial state of a substrate bonding apparatus for an LCD panel according to the present invention.

FIG. 2 illustrates an initial state of a substrate bonding apparatus for an LCD panel in accordance with an exemplary embodiment of the present invention.

As shown in FIG. 2, the substrate bonding apparatus includes a base frame 100, an upper chamber unit 210, a lower chamber unit 220, a chamber moving unit 310, 320, 330, 340 and 350, an upper stage 230, a lower stage 240, a sealing unit, alignment identifying cameras 520, an aligning unit, a linking unit 510, supporting units 710, and vacuum pump units 610, 621, and 622.

The base frame 100, which is included in the substrate bonding apparatus of the present invention, is fixed to the ground. The base frame 100 defines the appearance of the substrate bonding apparatus and functions to support the various elements of the substrate bonding apparatus.

The upper and lower chamber units 210 and 220 are mounted to upper and lower ends of the base frame 100, respectively, such that the upper and lower chamber units 210 and 220 are inter-connectable.

The upper chamber unit 210 includes an upper base 211 that is exposed to an external environment, and an upper chamber plate 212 that is fixed to a lower surface of the upper base 211 while being in close contact with the lower surface of the upper base 211. The upper chamber plate 212 has a rectangular frame structure such that a defined space is defined in the upper chamber plate 212.

The upper stage 230 is arranged in the space defined in the upper chamber plate 212. The upper stage 230 is mounted to the upper chamber unit 210 such that the upper stage 230 is linked to the upper chamber unit 210.

A seal member 213 is interposed between the upper base 211 and upper chamber plate 212 that constitute the upper chamber unit 210, to isolate the inner space of the upper chamber plate 212 from the outside of the upper chamber plate 212. The seal member 213 will be referred to as a "first seal member", hereinafter.

The lower chamber unit 220 includes a lower base 221 which is fixed to the base frame 100, and a lower chamber plate 222 which is mounted to an upper surface of the lower base 221 such that the lower chamber plate 222 is movable in forward, rearward, left and right directions. The lower chamber plate 222 has a rectangular frame structure such that a space is defined in the lower chamber plate 222.

The lower stage 240 is arranged in the space defined in the lower chamber plate 222. The lower stage 240 is mounted to the upper surface of the lower base 221.

In accordance with the illustrated embodiment of the present invention, the lower chamber unit 220 may further include a support plate 223 arranged between the base frame 100 and the lower base 221, to stably fix the base frame 100 and lower base 221.

A seal member 224 is interposed between the lower base 221 and lower chamber plate 222 that constitute the lower chamber unit 220, to isolate the inner space of the lower chamber plate 222 from the outside of the lower chamber plate 222. The lower stage 240 is arranged in the inner space of the lower chamber plate 222. The seal member 224 will be referred to as a "second seal member", hereinafter.

At least one support member 225 is arranged between the lower base 221 and the lower chamber plate 222, in order to support the lower chamber plate 222 such that the lower chamber plate 222 is spaced apart from the lower base 221 by a predetermined distance.

The support member 225 is fixed, at one end thereof, to a lower surface of the lower chamber plate 222. The other end of the support member 225 is connected to a lower portion of the lower base 221 so that it is freely movable horizontally.

Accordingly, the lower chamber plate 222 moves freely with respect to the lower base 221 by the support member 225. Thus, the lower chamber plate 222 may be moved in the forward, rearward, left and right directions.

The chamber moving unit includes a drive motor 310 that is fixed to the base frame 100, drive shafts 320 which are axially coupled to the drive motor 310, and connecting shafts 330 that extend in a direction perpendicular to the drive shafts 320 and receive drive forces from the drive shafts 320, respectively. The chamber moving unit also includes connectors 340, each of which connects an associated one of the connecting shafts 330 to an associated one of the drive shafts 320, and jacks 350, each of which is mounted to an end of an associated one of the connecting shafts 330.

The drive motor 310 includes a dual-shaft motor that is arranged at the bottom of the base frame 100 inside the base frame 100 and that is provided with shafts extending in parallel to the ground in opposite directions.

The drive shafts 320 are connected to respective shafts of the drive motor 310, to transmit the drive force of the drive motor 310 in a direction parallel to the shafts of the drive motor 310. On the other hand, the connecting shafts 330 are connected to the drive shafts 320 to transmit the drive forces from the drive shafts 320 in a direction perpendicular to the drive shafts 320, respectively.

The jack 350 mounted to each connecting shaft 330 functions to move the upper chamber unit 210 upward or downward in accordance with the rotation direction of the connecting shaft 330 that is in contact with the upper chamber unit 210. The jack 350 has a nut housing structure.

Each connector 340 includes bevel gears that mesh with each other to vertically transmit a rotating force transmitted horizontally from the drive shaft 320 to the associated connecting shaft 330.

The upper stage 230 includes an upper fixing plate 231 fixed to the upper chamber unit 210, an upper chucking plate 232, to which a first substrate is chucked, and a plurality of fixing blocks 233 arranged between the upper fixing plate 231 and the upper chucking plate 232. Similarly, the lower stage 240 includes a lower fixing plate 241 fixed to the lower chamber unit 220, a lower chucking plate 242, to which a second substrate is chucked, and a plurality of fixing blocks 243 arranged between the lower fixing plate 241 and the lower chucking plate 242.

Each of the upper and lower chucking plates 232 and 242 is constituted by an electrostatic chuck (ESC) which electrostatically chucks a substrate.

The sealing unit includes an O-ring 250 that is mounted on an upper surface of the lower chamber plate 222 included in the lower chamber unit 220 such that the O-ring 250 protrudes upward to a certain level. The O-ring 250 will be referred to as a "third seal member", hereinafter. The third seal member 250 is made of a rubber material.

The third seal member 250 has a thickness preventing the first and second substrates 110 and 120 respectively chucked to the upper and lower stages 230 and 240 arranged in the chamber units 210 and 220 from coming into contact with each other when the chamber units 210 and 220 are coupled to each other. Of course, when the third seal member 250 is compressed, its thickness is reduced to allow the first and second substrates 110 and 120 to come into contact with each other.

The aligning unit is arranged in the lower chamber unit 220 to determine the positions of the substrates 110 and 120 and the alignment of the substrates 110 and 120.

The linking unit 510 functions to link the chamber units 210 and 220 such that the chamber units 210 and 220 move equally in the same direction.

The linking unit 510 includes a plurality of receiving grooves 222a formed at the lower chamber plate 222 of the lower chamber unit 220 and a plurality of linear actuators 511, each fixed at one end thereof to the upper chamber unit 210 that moves a moving shaft 512, such that the moving shaft 512 may be received in an associated one of the receiving grooves 222a.

The aligning and linking units do not cause a displacement of the lower stage 240, but cause a movement of the lower chamber unit 220, thereby causing a displacement of the upper stage 230. As a result, alignment of the first and second substrates 110 and 120 is carried out.

The supporting units 710 protrude upward through the lower stage 240 to seat the second substrate 120 on the lower stage 240 during loading of the second substrate 120 or to unload the first and second substrate 110 and 120 bonded to each other from the lower stage 240. Each supporting unit 710 has a lift pin structure.

The upper ends of the supporting units 710 are arranged below the upper surface of the lower stage 240 when not loading the second substrate 120.

The vacuum pump units 610, 621, and 622 are arranged in at least one of the chamber units 210 and 220, to form a vacuum in the inner spaces of the chamber units 210 and 220.

Figure 3:
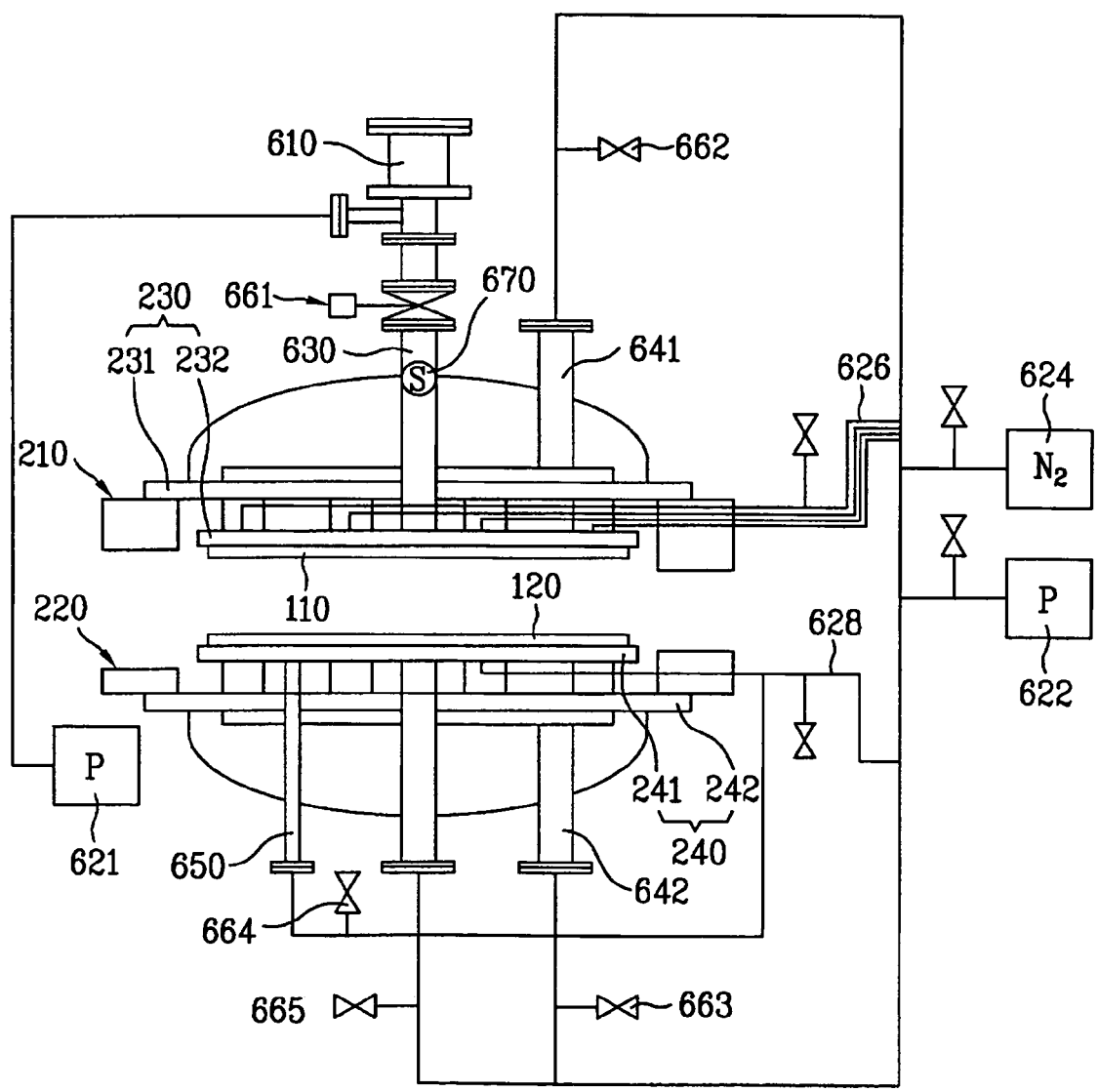
FIG. 3 is a schematic view illustrating a connection state of vacuum pumps in the substrate bonding apparatus according to the present invention.

As shown in FIG. 3, each of the vacuum pump units 610, 621, and 622 includes a high-vacuum pump 610 which may be a turbo molecular pump (TMP), and first through third low-vacuum pumps 621, 622, and 624, each of which may be a dry pump.

A pressure sensor 670 is arranged in a high-vacuum chamber conduit 630 that connects the inner spaces of the chamber units 210 and 220 to the high-vacuum pump 610. The high-vacuum chamber conduit 630 extends through a central portion of the upper chamber unit 210. The pressure sensor 670 measures the internal pressure of the inner spaces of the chamber units 210 and 220 where the substrates are arranged.

The first low-vacuum pump 621 is connected to the high-vacuum chamber conduit 630, to form a vacuum reaching a predetermined negative pressure in the inner spaces.

The second low-vacuum pump 622 is connected to low-vacuum chamber conduits 641 and 642 respectively extending through lateral walls of the upper and lower chamber units 210 and 220. The second low-vacuum pump 622 is also connected, via a line 628, to a substrate chucking conduit 650 connected to passages respectively defined in the stages 230 and 240 for vacuum-chucking of the substrates.

The third low-vacuum pump 624 is connected to the low-vacuum chamber conduits 641 and 642 and to the conduit 650. The third low-vacuum pump 624 is also connected, via lines 626, to the upper chucking plate 232 that is connected to a plurality of passages defined in the upper stage 230, respectively.

At least one opening/closing valve is arranged in each of the conduits 630, 641, 642, and 650 and lines 626 and 628. In FIG. 3, the opening/closing valves are designated by reference numerals 661, 662, 663, 664, and 665.

The conduits 641, 642, and 650, to which the third low-vacuum pump 624 is connected, are also used as venting conduits. In a venting process, gas, for example, $N_2$ gas, is injected from the third low-vacuum pump 624 into the inner space of each chamber unit 210 or 220 maintained in a vacuum state, to change the inner space to an atmospheric state, via the conduits 641, 642, and 650. The third low-vacuum pump 624 is connected to main vent holes (not shown), which are formed through the upper chucking plate 232, via the venting lines 626, respectively.

The alignment identifying cameras 520 observe alignment marks (not shown) formed on the substrates 110 and 120, to identify alignment of the substrates 110 and 120. Each alignment identifying camera 520 is mounted to the upper chamber unit 210 (or the lower chamber unit 220) such that the alignment identifying camera 520 extends through the upper chamber unit 210 (or the lower chamber unit 220).

Figure 4A:
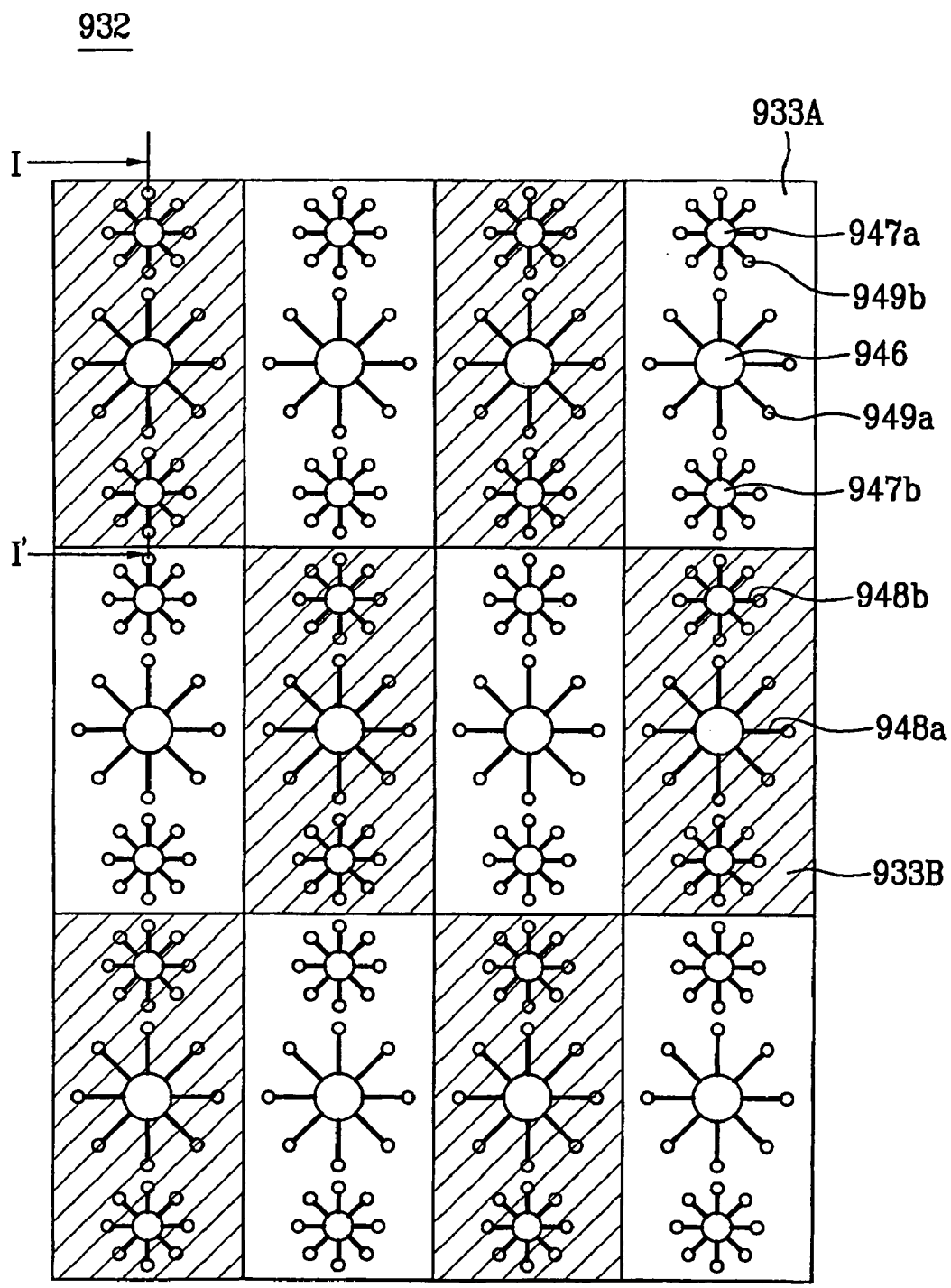
FIG. 4A is a schematic view illustrating an upper electrostatic chuck constituting an upper chucking plate shown in FIGS. 2 and 3.
Figure 4B:
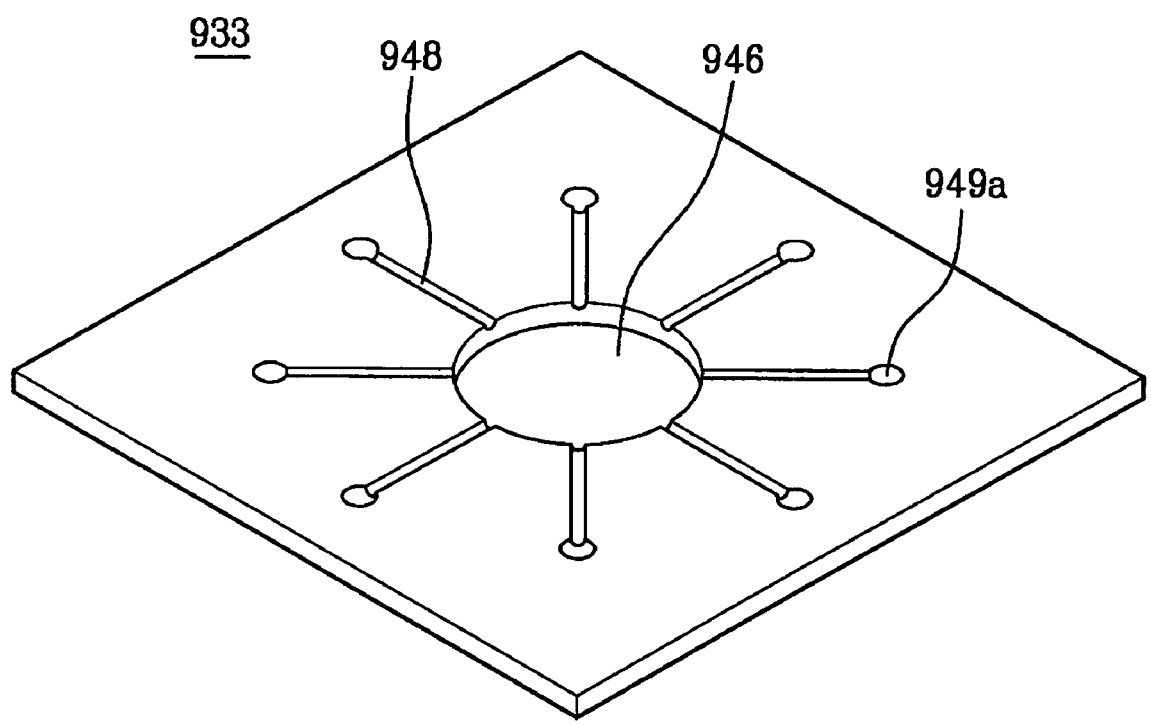
FIG. 4B is a perspective view illustrating a main venting hole region shown in FIG. 4A.
Figure 5:
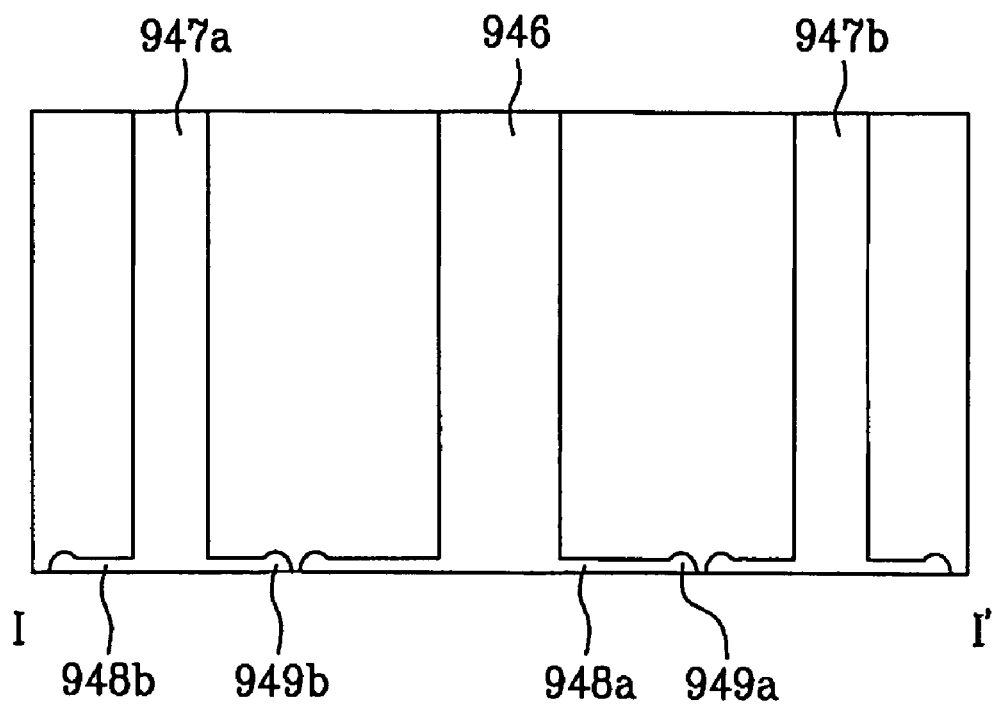
FIG. 5 is a cross-sectional view taken along a line I-I' of FIG. 4A.

FIG. 4A schematically illustrates an upper ESC 932 included in the upper chucking plate 232 shown in FIG. 3. FIG. 4B is a perspective view illustrating a main venting hole region 933 shown in FIG. 4A. FIG. 5 is a cross-sectional view taken along the line I-I' of FIG. 4A.

Referring to FIGS. 4A, 4B, and 5, together with FIG. 3, the upper ESC 932 used in the substrate bonding apparatus according to the illustrated embodiment of the present invention includes a plurality of first electrostatic blocks 933A, to which a first voltage is supplied from an upper ESC controller (not shown), and a plurality of second electrostatic blocks 933B, to which a second voltage different from the first voltage is supplied from the upper ESC controller.

For simplicity of description, it is assumed that the upper ESC 932 includes 6 first electrostatic blocks 933A and 6 second electrostatic blocks 933B. The first electrostatic blocks 933A and second electrostatic blocks 933B are alternately arranged in longitudinal and lateral directions.

Each of the first and second electrostatic blocks 933A and 933B has a main venting hole 946 formed through a central portion of the electrostatic block 933A or 933B, and sub venting holes 947a and 947b arranged at opposite sides of the main venting hole 946 in a longitudinal direction of the electrostatic block 933A or 933B, respectively.

Each of the first and second electrostatic blocks 933A and 933B also has on its back surface a plurality of first venting grooves 948a extending radially from the main vent hole 946 of the first or second electrostatic block 933A or 933B, and a plurality of second venting grooves 948b extending radially from each sub venting hole 947a or 947b of the first or second electrostatic block 933A or 933B.

Each of the first and second electrostatic blocks 933A and 933B further on its back surface a plurality of first circular grooves 949a formed at respective outer ends of the first venting grooves 948a of the first or second electrostatic block 933A or 933B, and a plurality of second circular grooves 949b formed at respective outer ends of the second venting grooves 948b of the first or second electrostatic block 933A or 933B.

Figure 6:
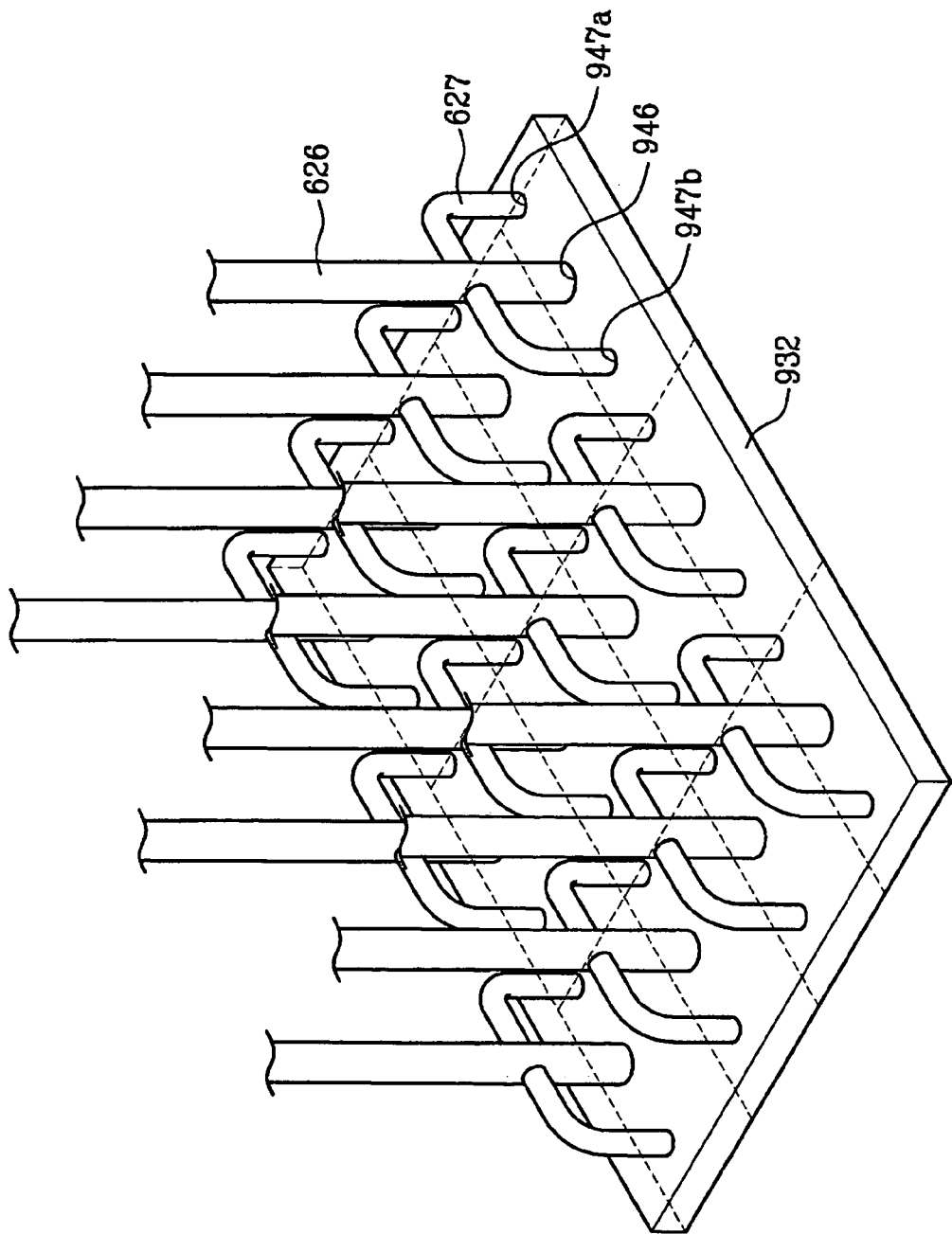
FIG. 6 is a perspective view illustrating lines connected to the upper electrostatic chuck shown in FIG. 4A.

As shown in FIG. 6, the main venting lines 626 connected to the third low-vacuum pump 624 are connected to the main venting holes 946 of each electrostatic block 933A or 933B, respectively, in a venting process.

Also, sub venting lines 627, that branch off from associated ones of the main venting lines 626, respectively and have a bent structure, are connected to the sub venting holes 947a and 947b of each electrostatic block 933A or 933B, respectively, in the venting process.

Thus, in the upper ESC 932 of the substrate bonding apparatus according to the illustrated embodiment of the present invention, the main venting holes 949 of the electrostatic blocks 933A and 933B are connected to the main venting lines 626, respectively, in the venting process. Also, the sub venting holes 947a and 947b of the electrostatic blocks 933A and 933B are connected to the sub venting lines 627 that branch off from the main venting lines 626, respectively, in the venting process.

Accordingly, the substrate bonding apparatus according to the illustrated embodiment of the present invention can enhance the uniformity of venting in the venting process, thereby preventing poor bonding of the substrates caused by non-uniform venting.

Meanwhile, in the substrate bonding apparatus according to the illustrated embodiment of the present invention, when it is desired to bond the first and second substrates 110 and 120, the substrate chucked to the upper ESC 932 must be released from the upper ESC 932. To this end, the upper ESC 932 is turned off, and at the same time, gas is injected into the upper ESC 932 via the main venting holes 946 and sub venting holes 947a and 947b of the electrostatic blocks 933A and 933B. As a result, the substrate chucked to the upper ESC 932 is released from the upper ESC 932, and moves downward due to gravity. Thus, it is possible to achieve a reduction in processing time.

Hereinafter, the process for bonding the substrates using the substrate bonding apparatus having the above-described configuration according to the illustrated embodiment of the present invention will be described in detail.

Figure 7:
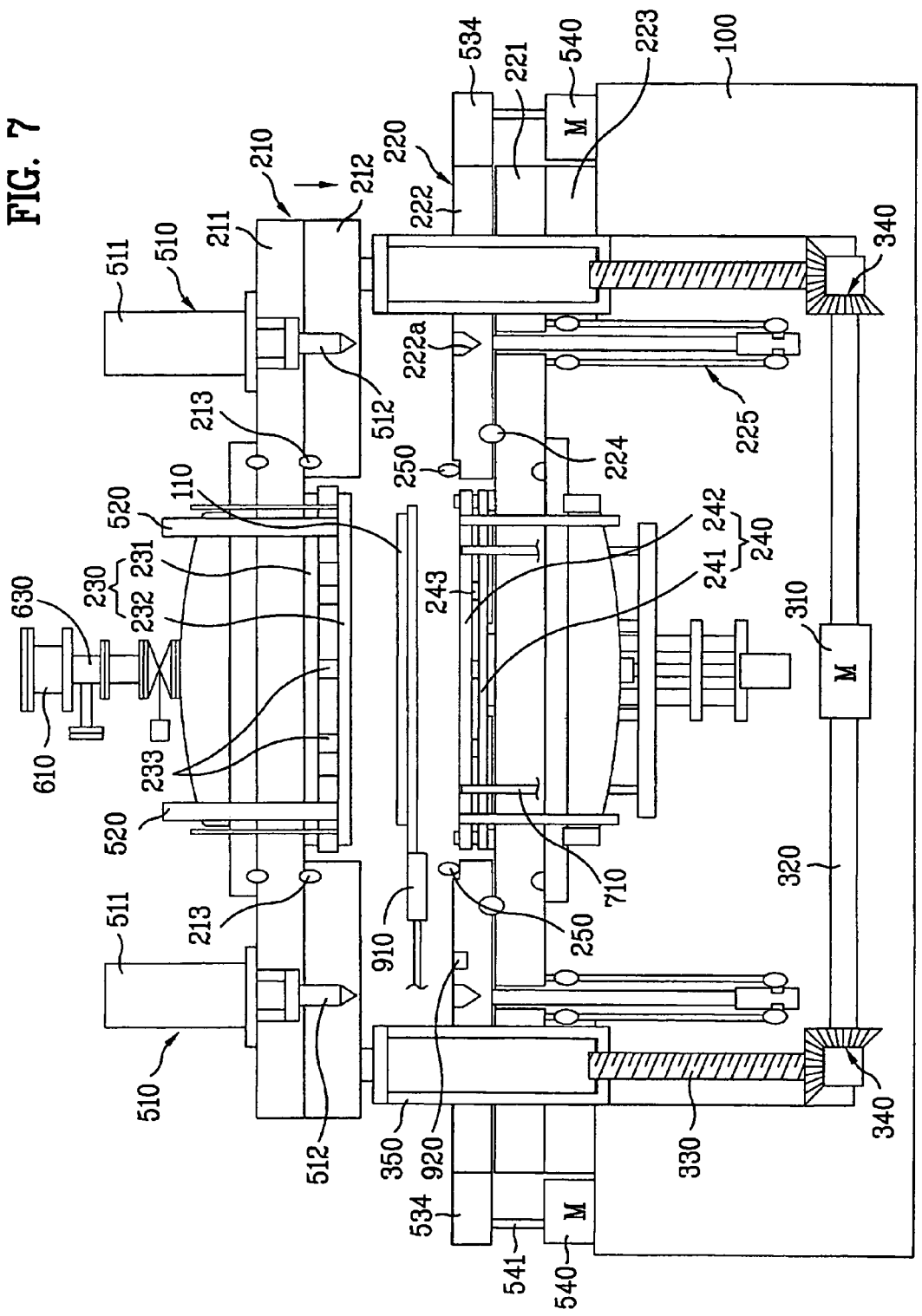
FIG. 7 is a schematic view illustrating a substrate loading procedure carried out by a loader in the substrate bonding apparatus according to the present invention.

In the substrate bonding process, the first substrate 110 coated with the sealant is transferred from an initial position shown in FIG. 2 to a space defined between the chamber units 210 and 220 by the loader 910, for loading of the first substrate 110, as shown in FIG. 7.

Figure 8:
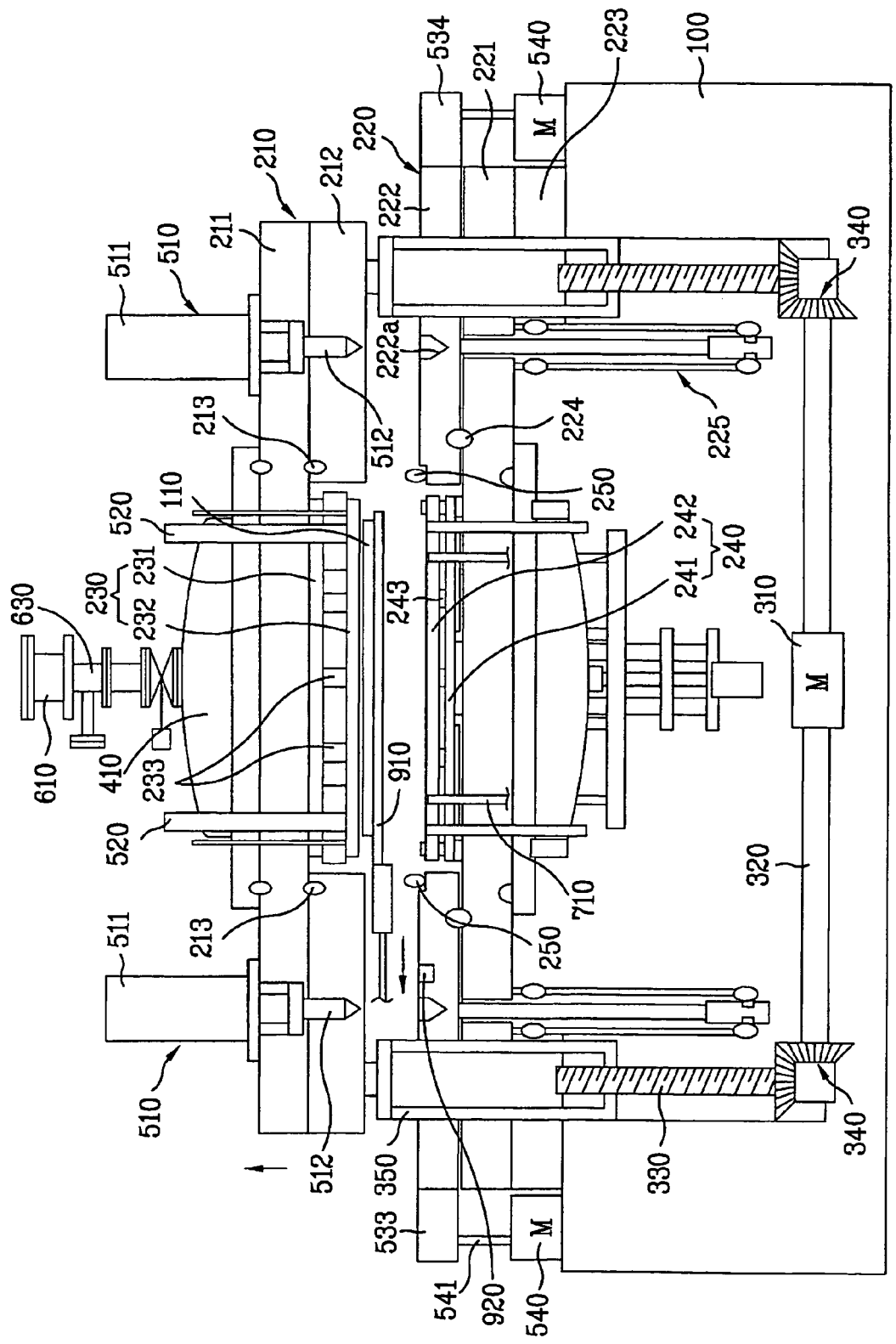
FIGS. 8 and 9 are schematic views illustrating a procedure for fixing a first substrate to an upper stage in the substrate bonding apparatus according to the present invention.

The first substrate 110 loaded in the above-described manner is then attached to the upper stage 230 in accordance with a downward movement of the upper chamber, a vacuum chucking operation of the second low-vacuum pump 622, and an electrostatic chucking operation of the upper ESC 932 included in the chucking plate 232, as shown in FIG. 8.

Figure 9:
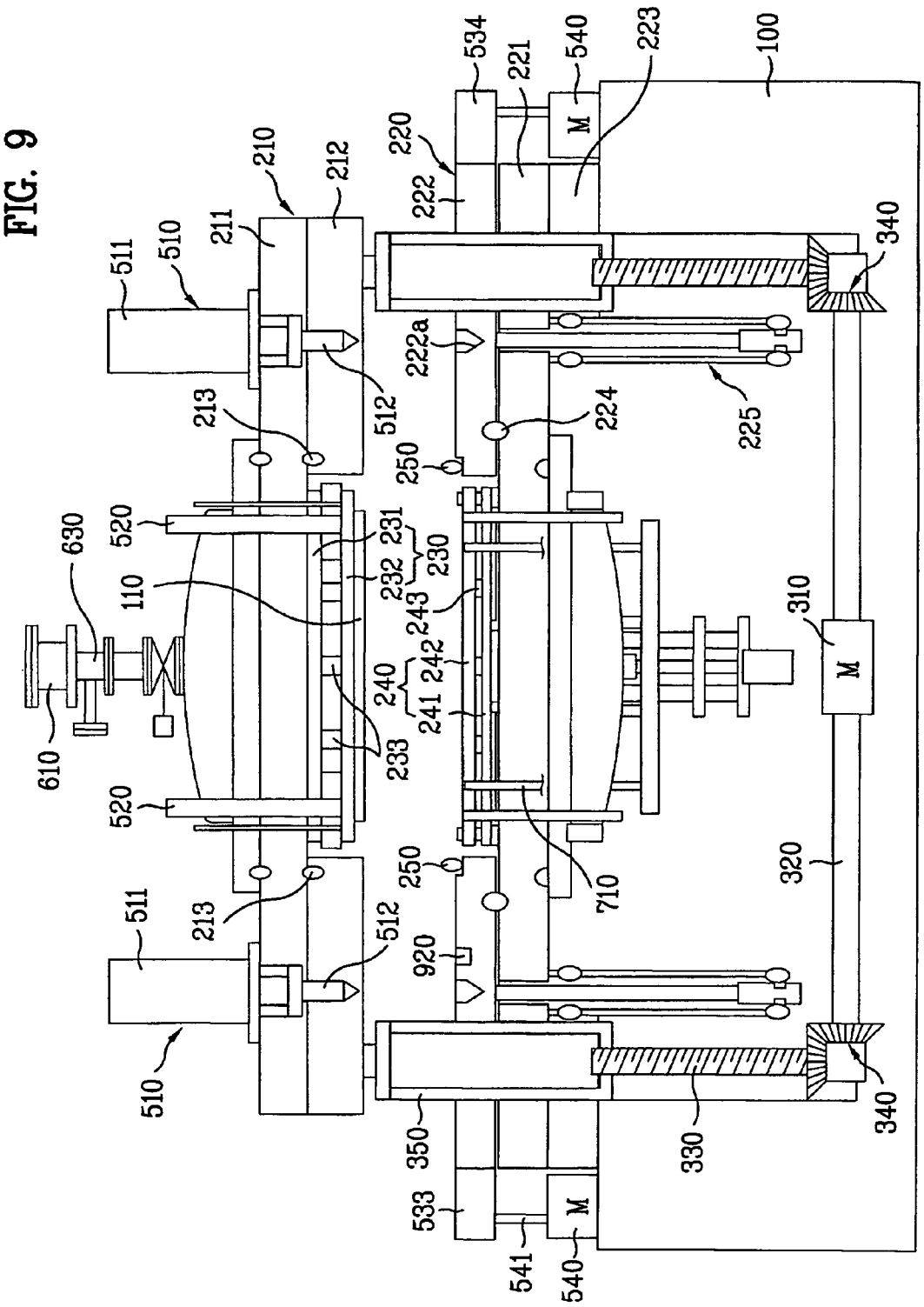

After completion of the attachment of the first substrate 110 to the upper stage 230, the loader 910 retracts from the space between the chamber units 210 and 220, as shown in FIG. 9. The upper chamber unit 210 then returns to an initial position thereof while moving upward.

Figure 10:
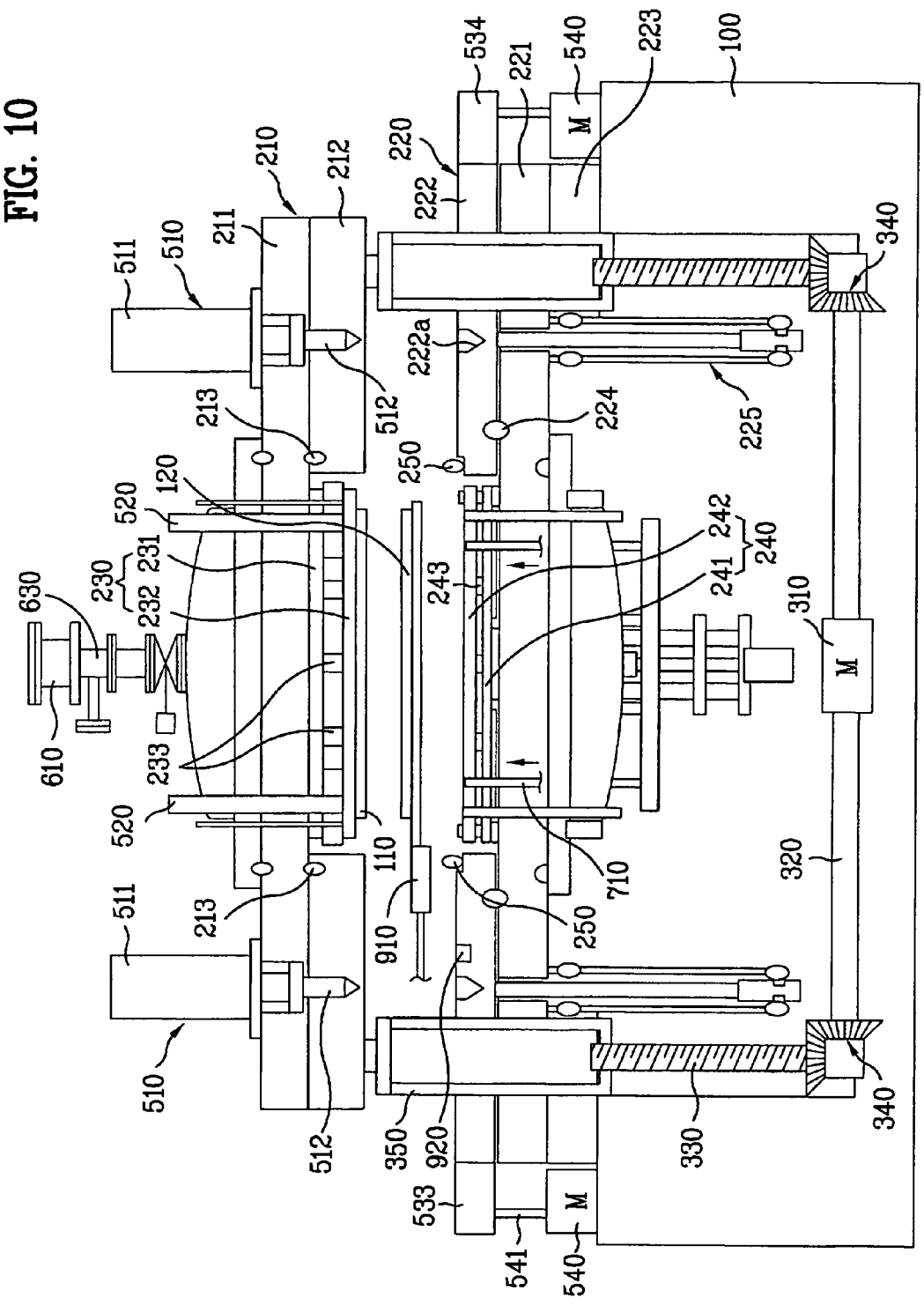
FIGS. 10 to 12 are schematic views illustrating procedures for loading a second substrate and fixing the second substrate to a lower stage in the substrate bonding apparatus according to the present invention.

Thereafter, the loader 910 extends again to the space between the chamber units 210 and 220, as shown in FIG. 10, to load the second substrate 120 dispensed with the liquid crystal material into the space between the chamber units 210 and 220.

Figure 11:
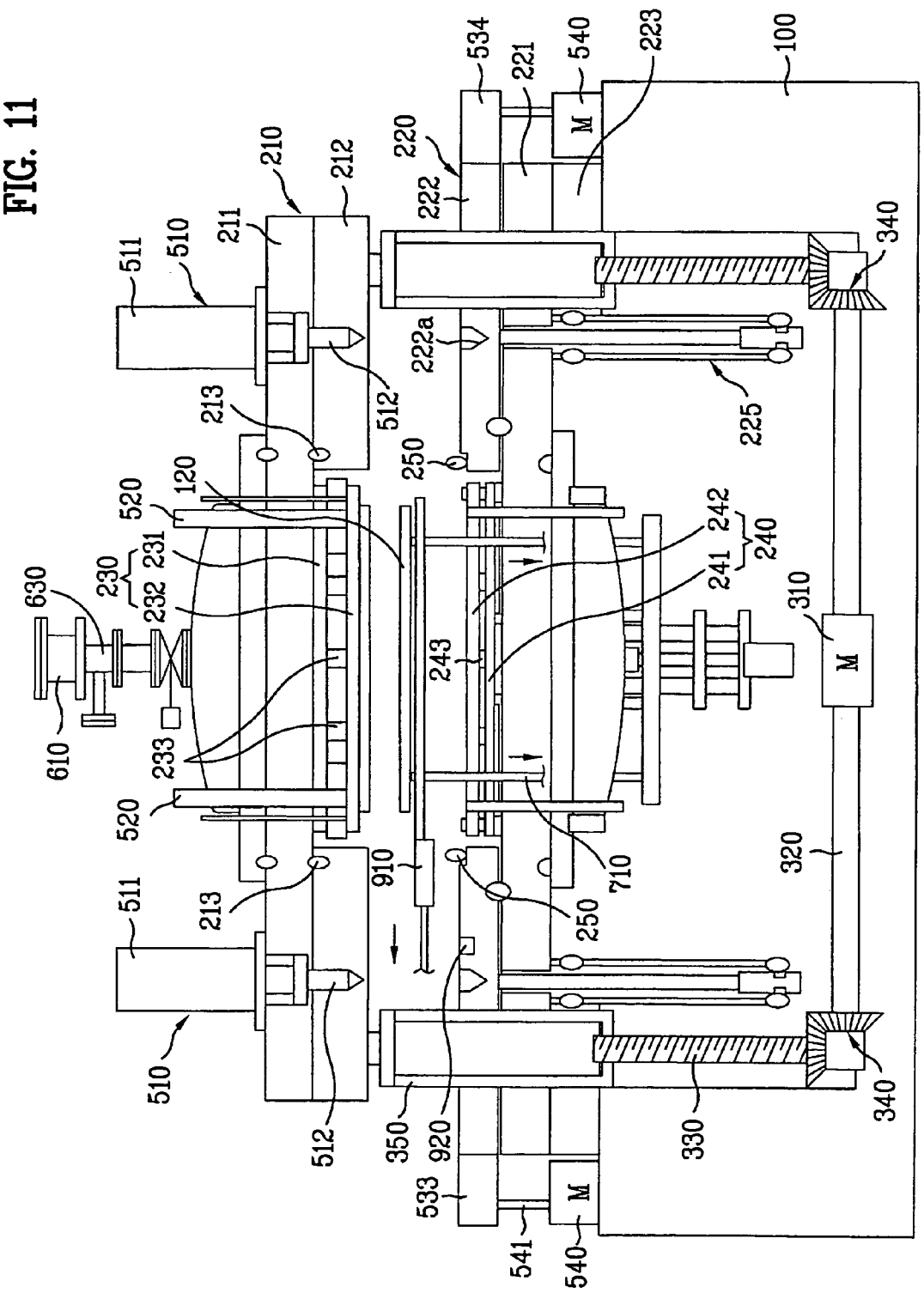
Figure 12:
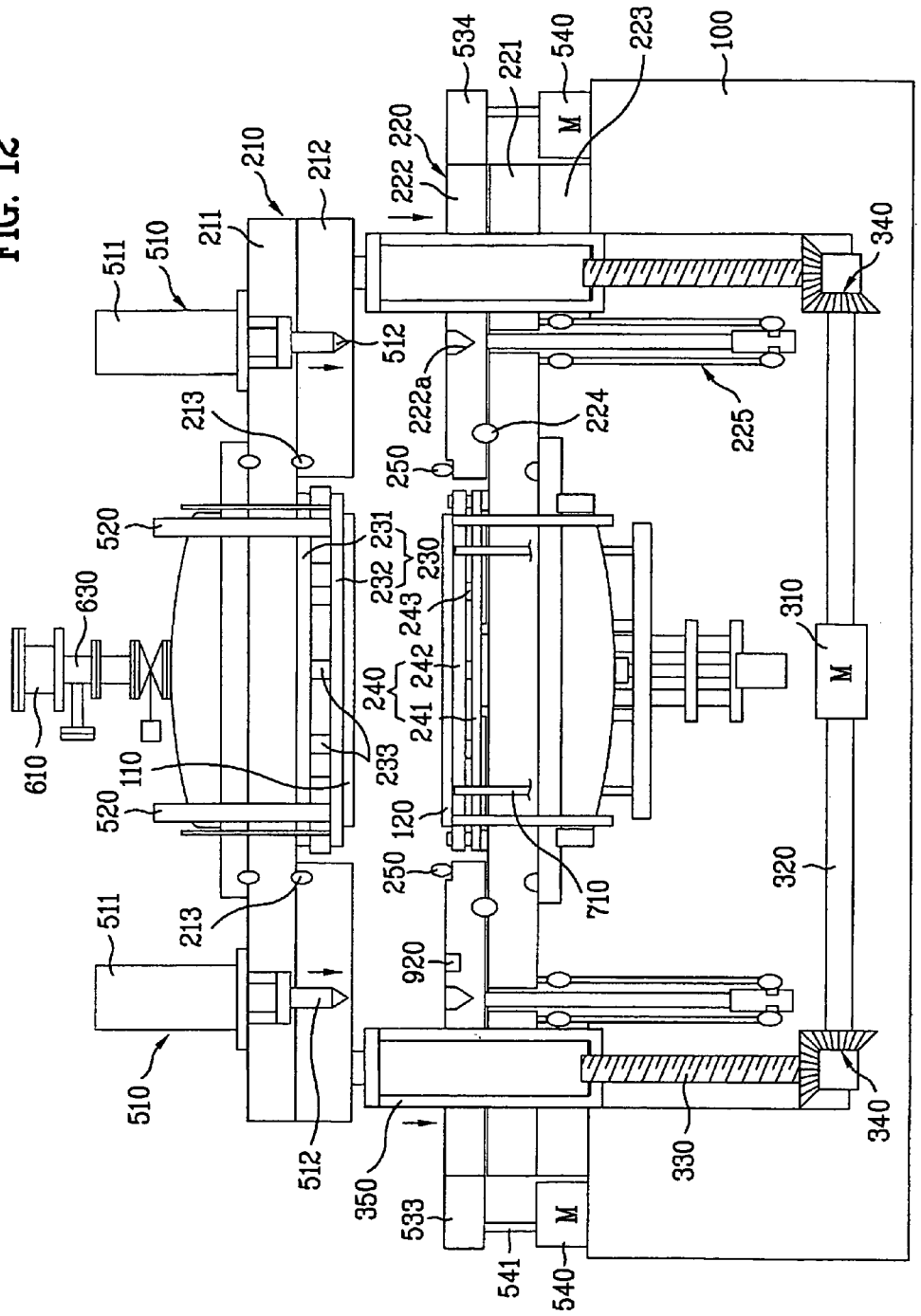

In this state, the lift-pin-shaped supporting units 710 move upward the second substrate 120 laid on the loader 910 to a predetermined level while moving upward through the lower stage 240, as shown in FIG. 11. The loader 910 retracts after the second substrate 120 is separated from the loader 910 in accordance with the upward movement of the supporting units 710. After the retraction of the loader 910, the supporting units 710 move downward to seat the second substrate 120 on the lower stage 240, as shown in FIG. 12.

At this time, the lower stage 240 fixes the seated second substrate 120 using a vacuum force and an electrostatic force.

After completion of the loading of the substrates 110 and 120, the upper chamber unit 210 is moved downward by the chamber mover. In accordance with the downward movement of the upper chamber unit 210, the moving shafts 512 of the linear actuators 511, which protrude downward are moved downward such that they are positioned at a predetermined level.

Figure 13:
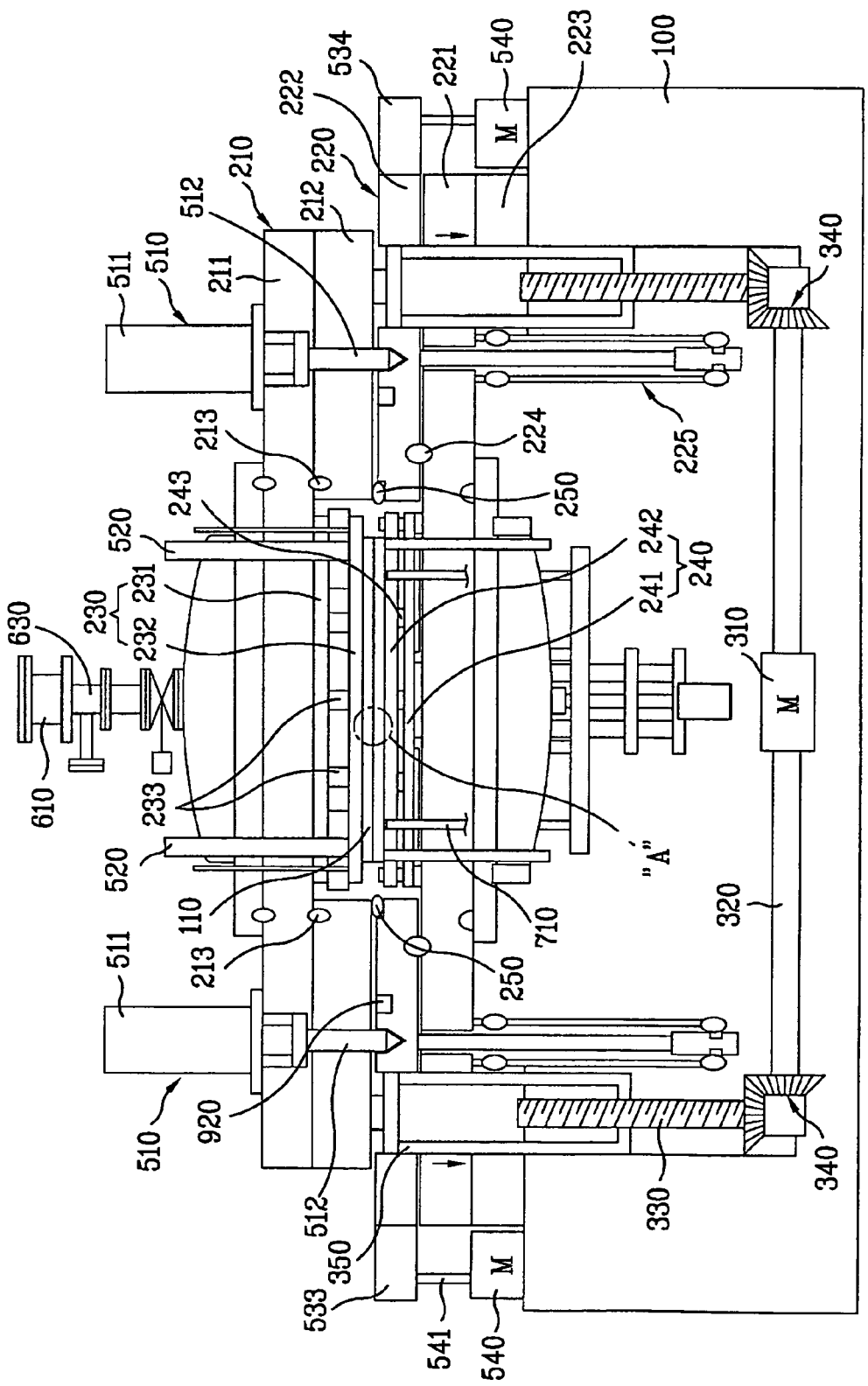
FIG. 13 is a schematic view illustrating operations of the stages for bonding the substrates.

In this case, the moving shafts 512 of the linear actuators 511 are received in the receiving grooves 222a formed at the upper surface of the lower chamber plate 222 of the lower chamber unit 220, as shown in FIG. 13. Also, the upper chamber plate 212 of the upper chamber unit 210 supported by the jacks 350 of the chamber mover comes into contact with the upper surface of the third seal member 250 mounted along the inner peripheral edge of the lower chamber plate 222.

Figure 14:
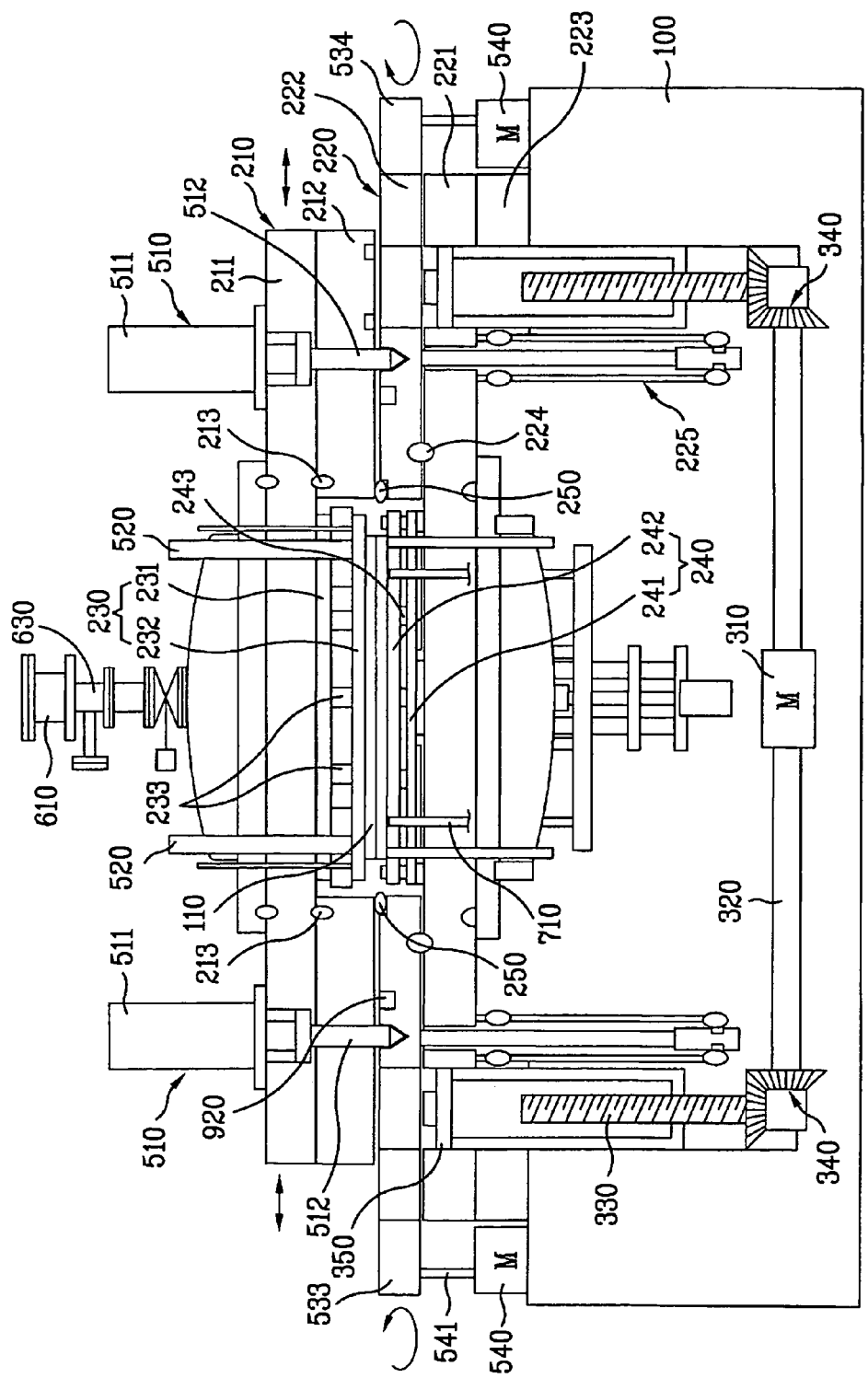
FIG. 14 is a schematic view illustrating alignment of the substrates carried out by an aligning unit included in the substrate bonding apparatus according to the present invention.

When the jacks 350 further move downward from the above-described state, they are separated from the upper chamber unit 210, as shown in FIG. 14. In this state, the inner space defined between the chamber units 210 and 220, in which the substrates 110 and 120 are disposed, is sealed from the outside of the space by the weight of the upper chamber unit 210 and the atmospheric pressure.

In this state, the substrates 110 and 120 respectively attached to the upper and lower stages 230 and 240 are maintained to form a fine gap therebetween without coming into contact with each other. The reason why the substrates 110 and 120 must be maintained in this state is to enable alignment of the substrates 110 and 120 to be carried out, to enable bonding of the substrates 110 and 120 in a vacuum state, and thus, to enable complete bonding of the substrates 110 and 120 to be achieved using a pressure difference in a venting process. The gap between the upper and lower chamber units 210 and 220 (or the gap between the substrates) is measured by a gap measuring sensor 920.

Thereafter, the first low-vacuum pump 621 operates to form a vacuum in the space where the substrates 110 and 120 are disposed. At this time, the main venting lines 626 are maintained in a closed state by the valves thereof.

When it is determined, in accordance with a pressure measurement by the pressure sensor 660, that the space where the substrates 110 and 120 are disposed is evacuated to a predetermined vacuum level in accordance with operation of the first low-vacuum pump 621, the high-vacuum pump 610 operates to form a complete vacuum in the space.

When the high-vacuum pump 610 operates, the operation of the first low-vacuum pump 621 is stopped. This is because the high-vacuum pump 610 and first low-vacuum pump 621 use the same conduit, namely, the high-vacuum chamber conduit 630.

When a complete vacuum is formed in the space where the substrates 110 and 120 are disposed, alignment of the substrates is carried out by the alignment identifying cameras 520 and aligning unit. That is, the alignment identifying cameras 520 observe the alignment marks (not shown) formed on the substrates 110 and 120, to identify any positional deviation between the substrates 110 and 120.

The identified positional deviation is used as a reference to determine the distance by which the upper stage 230 should be moved.

After completion of the identification of the positional deviation, the distance by which the upper stage 230 should be moved is calculated based on the identified positional deviation.

The reason why the distance by which the upper stage 230 should be moved is calculated is that the positional alignment of the substrates 110 and 120 respectively fixed to the stages 230 and 240 should be carried out by movement of the upper stage 230 because the lower stage 240 is fixed to the upper surface of the lower base 221 such that the lower stage 240 moves separately from the lower chamber plate 222 of the lower chamber unit 220, whereas the upper stage 230 is fixed to the upper chamber unit 210 such that the upper stage 230 moves integrally with the upper chamber plate 210 and upper base 211.

When the lower chamber plate 222 is moved in a desired direction by a predetermined distance through the above-mentioned procedure, the upper chamber unit 210 is moved in the same direction by the predetermined distance, integrally with the lower chamber plate 222, in accordance with operation of the linking unit 510.

Accordingly, the substrates 110 and 120 are completely aligned with each other.

The procedure for aligning the substrates 110 and 120 may not be achieved through a single aligning operation. Where the alignment marks formed at each substrate are divided into rough marks and fine marks, an aligning operation using the fine marks is carried out after an aligning operation using the rough marks.

Figure 15A:
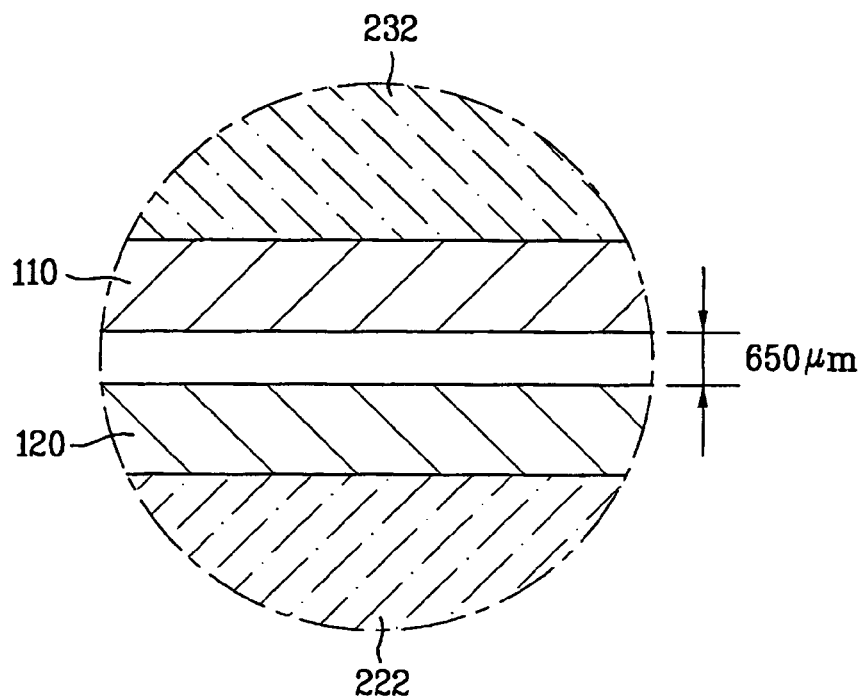
FIGS. 15A and 15B are enlarged views corresponding to a portion A of FIG. 13, respectively.
Figure 15B:
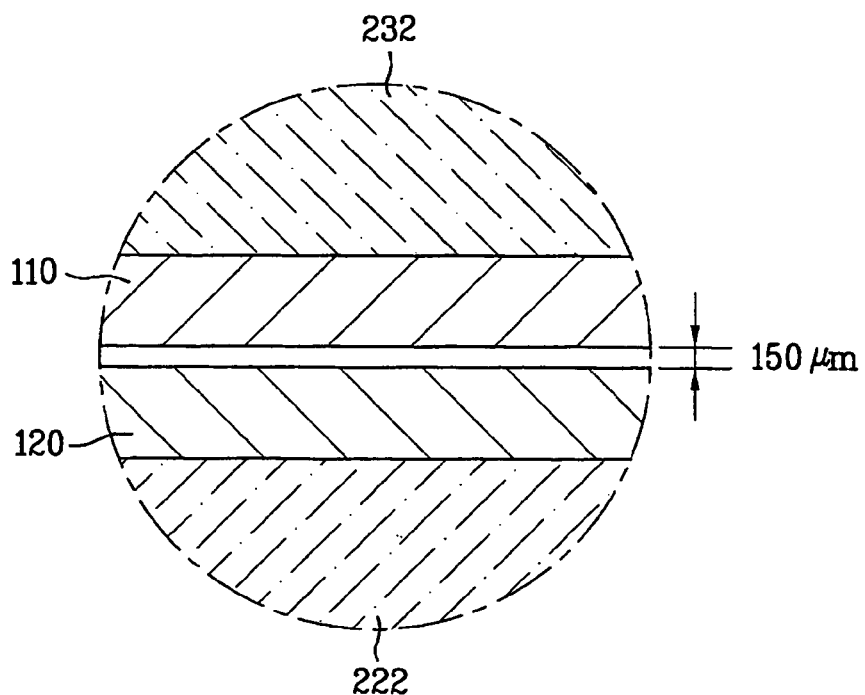

The aligning operation using the rough marks is carried out under the condition in which the distance between the substrates 110 and 120 is about 500 to 800 μm, preferably about 650 μm, as shown in FIG. 15A, which is an enlarged view corresponding to a portion A of FIG. 13. On the other hand, the aligning operation using the fine marks is carried out when the distance between the substrates 110 and 120 is about 100 to 250 μm, preferably about 150 μm, as shown in FIG. 15B.

Figure 16A:
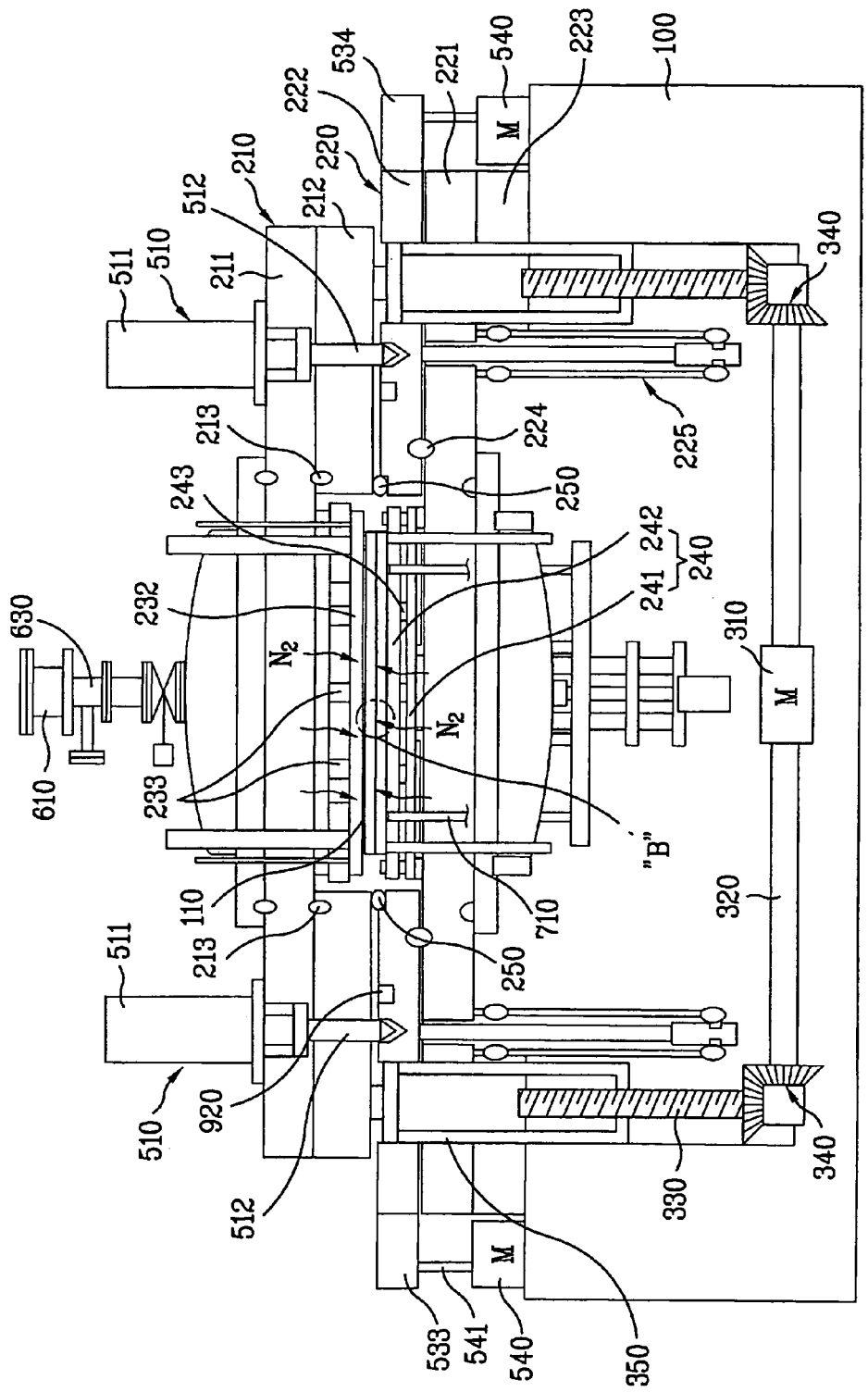
FIG. 16A is a schematic view illustrating a state in which the substrate bonding apparatus is ready to carry out a venting process.
Figure 16B:
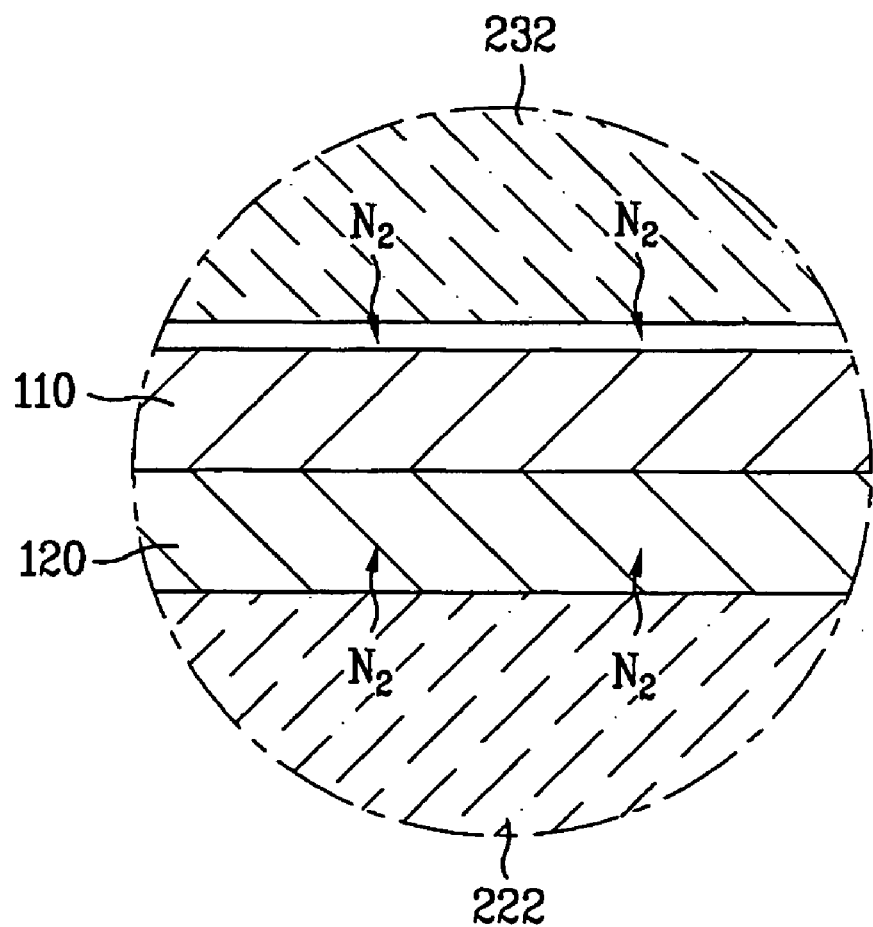
FIG. 16B is an enlarged view corresponding to a portion B of FIG. 16A.

After completion of the alignment of the substrates 110 and 120, the voltage supplied to the upper stage 230 generating an electrostatic force is cut off. At the same time, a venting process for evacuating the space where the substrates 110 and 120 are disposed is carried out, as shown in FIGS. 16A and 16B. FIG. 16B is an enlarged view corresponding to a portion B of FIG. 16A.

That is, $N_2$ gas is injected into the space via the low-vacuum chamber conduits 641 and 642 connected to the third vacuum pump 624 and the main venting lines 626. As a result, the space has an atmospheric pressure.

In the venting process, the main venting holes 946 and sub venting holes 947a and 947b formed through the electrostatic blocks 933A and 933b of the upper ESC 932 constituting the upper chucking plate 232 are connected to the main venting lines 626 and sub venting lines 627, as shown in FIG. 6. As a result, the first substrate 110 electrostatically chucked to the upper chucking plate 232 falls down onto the second substrate 120. At the same time, the first substrate 110 comes into tight contact with the second substrate 120 due to the pressure of the $N_2$ gas discharged out of the upper ESC 932. As the venting process is further advanced, the substrates 110 and 120 are completely bonded to each other due to the difference between the pressure between the substrates 110 and 120 and the atmospheric pressure outside the substrates 110 and 120.

That is, because the space defined between the substrates 110 and 120 is maintained in a vacuum state, the substrates 110 and 120 more tightly come into contact with each other by virtue of the difference between the pressure between the substrates 110 and 120 and the atmospheric pressure outside the substrates 110 and 120. As a result, the substrates 110 and 120 are completely bonded to each other.

Thereafter, the bonded substrates 110 and 120 are unloaded. Thus, the bonding procedure is completed.

A bonding procedure for next substrates is carried out, simultaneously with the unloading of the bonded substrates 110 and 120.

As apparent from the above description, the substrate bonding apparatus according to the illustrated embodiment of the present invention provides various effects.

First, in the substrate bonding apparatus according to the present invention, the ESC, which chucks a substrate, and subsequently releases the chucked substrate, is divided into a plurality of electrostatic blocks each having a main venting hole and a plurality of sub-venting holes, to which gas is supplied via a plurality of main venting lines in a venting process. In accordance with this configuration, the uniformity of venting in the venting process is greatly enhanced, thereby preventing poor bonding of the substrates.

Second, the venting carried out when the substrate chucked to the ESC is released from the ESC can be finely controlled using the venting holes of the electrostatic blocks such that the chucked substrate falls down uniformly onto the lower substrate. Accordingly, it is possible to prevent air from being introduced into a space defined between the substrates.

Third, in addition to the prevention of poor bonding of substrates, the substrate bonding apparatus according to the present invention can reduce the time taken to release the chucked substrate, thereby achieving a great enhancement in productivity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate bonding apparatus for bonding a first substrate and a second substrate for a liquid crystal display panel using a venting process, comprising:
    a lower chucking plate chucking the second substrate; and
    an upper chucking plate including a plurality of blocks each having a main venting hole and at least two sub venting holes;
    a plurality of main venting lines that are connected to the main venting holes of the blocks;
    sub-venting lines that branch off from each of the main venting lines and are connected to the at least two sub-venting holes associated with the main venting line, wherein the sub-venting lines are arranged outside of the upper chucking plate;
    wherein the upper chucking plate chucks the first substrate in accordance with a chucking operation of the blocks and subsequently releases the chucked first substrate such that the first substrate falls down toward the second substrate.

2. The substrate bonding apparatus according to claim 1, wherein the at least two sub venting holes are arranged at opposite sides of the main venting hole of the block.

3. The substrate bonding apparatus according to claim 1, wherein each of the blocks further includes:
    a plurality of first venting grooves radially branching from the main venting hole of the block; and
    a plurality of second venting grooves radially branching from each of the first venting grooves.

4. The substrate bonding apparatus according to claim 3, wherein each of the blocks further includes:
    a plurality of first circular grooves formed at outer ends of the first venting grooves of the block; and
    a plurality of second circular grooves formed at outer ends of the second venting grooves of the block.

5. The substrate bonding apparatus according to claim 1, wherein the first substrate chucked to the upper chucking plate falls down toward the second substrate by gas injected through the main venting holes and the sub-venting holes when a voltage applied to the blocks is cut off.

6. The substrate bonding apparatus according to claim 1, wherein each of the blocks is an electrostatic chuck that chucks the first substrate using an electrostatic force generated when a voltage is applied to the block.

* * * * *